United States Patent [19]

Chang et al.

[11] Patent Number: 4,731,340
[45] Date of Patent: Mar. 15, 1988

[54] DUAL LIFT-OFF SELF ALIGNING PROCESS FOR MAKING HETEROJUNCTION BIPOLAR TRANSISTORS

[75] Inventors: Mau-Chung F. Chang, Thousand Oaks; Peter M. Asbeck, Newbury Park, both of Calif.

[73] Assignee: Rockwell International Corporation, El Segundo, Calif.

[21] Appl. No.: 17,957

[22] Filed: Feb. 24, 1987

[51] Int. Cl.$^4$ .......................................... H01L 21/265
[52] U.S. Cl. ...................... 437/31; 437/944; 437/238; 437/203; 437/24; 437/22; 437/133; 357/34; 357/16; 156/656
[58] Field of Search .............. 357/34, 16, 65; 427/93, 427/94; 29/589, 590, 591, 578, 580, 576 B; 148/1.5, 187, 175, DIG. 72, DIG. 10, DIG. 11, DIG. 100; 156/643, 652, 656; 437/31, 944, 238, 22, 133, 24

[56] References Cited

U.S. PATENT DOCUMENTS

| 4,090,006 | 5/1978 | Havas et al. | 156/643 |
| 4,380,774 | 4/1983 | Yoder | 357/16 |
| 4,448,800 | 5/1984 | Ehara et al. | 427/94 |

FOREIGN PATENT DOCUMENTS 0177246  4/1986  European Pat. Off. .............. 357/34

OTHER PUBLICATIONS

Kroemer, H. "Heterostructure Bipolar . . . " Proceedings of the IEEE vol. 70, #1, Jan. 1982, pp. 13–25.

Primary Examiner—Brian E. Hearn
Assistant Examiner—Kevin McAndrews
Attorney, Agent, or Firm—H. Fredrick Hamann; Craig O. Malin

[57] ABSTRACT

A dual lift-off technique is used to provide self-alignment of the emitter area, the emitter contact, and the base contact of a heterojunction, bipolar transistor. A photoresist pattern which defines an emitter adjacent a base contact is formed on a suitable heterojunction bipolar semiconductor wafer. A base contact is formed by etching through the first semiconductor to the heterojunction and depositing metal on the second semiconductor. Dielectric is then deposited on the base contact. The photoresist is then lifted off with its dual covering of dielectric and metal. The emitter contact metal can then be deposited without requiring critical alignment because the base contact is covered with dielectric.

18 Claims, 7 Drawing Figures

DUAL LIFT-OFF SELF ALIGNING PROCESS FOR MAKING HETEROJUNCTION BIPOLAR TRANSISTORS

STATEMENT OF GOVERNMENT INTEREST

The Government has rights in this invention pursuant to Contract No. N0014-86-C-0078 awarded by the Department of the Navy.

BACKGROUND OF THE INVENTION

This invention relates to the field of solid state electronics, and particularly to a process for making heterojunction bipolar transistors using a dual lift-off technique to provide self alignment of the emitter and base contacts.

In heterojunction bipolar transistors (HBTs), the intrinsic transistor speed is governed by the vertical layer structure of the device which is incorporated during growth of the wafer. This aspect of the device can be optimized and controlled using molecular beam epitaxy (MBE) or metal organic chemical vapor deposition (MOCVD) growth technology.

Subsequent processing of the wafer determines the lateral extent of the different device regions (emitter area, extrinsic base area, and collector area). Obtaining accurate lateral geometry is important because it determines the magnitude of parasitic extrinsic circuit elements associated with the transistor, notably, base-collector capacitance and base resistance. Currently, these parasitic elements have a major role in determining bipolar circuit speed, particularly in HBTs which are intrinsically extremely fast.

The dimensions of the transistor also influence the power dissipation at which the highest speeds are achieved. It is important to reduce the dimension of HBTs in order to both decrease their parasitic elements and to improve their speed-power performance. This requires processing techniques which can accurately produce very small geometry HBTs.

In typical processes, minimum device dimensions are determined by three factors: (1) Minimum lithographic feature size, (2) Variations of dimensions as a result of process nonuniformity, and (3) alignment inaccuracies. Currently, features as small as 0.8 to 1 $\mu$m can be defined using optical lithography, and dimensions can be reasonably reproduced with available process controls. However, the third factor, alignment inaccuracies, is a considerable problem in fabricating HBTs. To prevent two separate neighboring mask layers from overlapping, it is necessary to provide a substantial tolerance in the geometry of the transistor. However, if the same mask can be used to define neighboring regions (called self-alignment), the tolerance can be reduced to zero and the size of the HBT reduced.

In an HBT structure, there are three patterns that must be critically aligned to one another (corresponding to two critical alignments). These are: (1) the active emitter area, (2) the emitter contact, and (3) the base contact. There are prior art HBT processes which utilize some self-alignment to eliminate one registration or, at least, render it non-critical. For example in the process described by Nagata, et al, the base and the base contact are produced without requiring separate masks by depsiting an SiO$_2$ sidewall to separate the emitter and the base contact ('A new self-aligned structure AlGaAs/GaAs HBT for high speed digital ciruits', *Inst. Phys. Conf. Ser.* 79, 1985, pp. 589-594). However, further improvement is desirable to provide a fully self-aligned process in which the critical dimensions of all three patterns are defined (or made non-critical) with a single photoresist mask step.

SUMMARY OF THE INVENTION

It is an object of the invention to provide a process for fabricating improved heterojunction bipolar transistors (HBTs).

It is an object of the invention to provide a process for fabricating very small HBTs.

It is an object of the invention to provide a process for fabricating HBTs having low parasitic elements and having improved speed-power performance.

It is an object of the invention to provide a process for fabricating HBTs which utilizes a single photoresist mask step to define the active emitter area, the emitter contact area, and the base contact area.

According to the invention, a single photoresist pattern is used to define an etch down to the base layer of a heterojunction bipolar semiconductor wafer and thereby delineate active emitter and base areas. Subsequently, the same photoresist is used to mask the deposition of base contact metal and the subsequent deposition of an appropriate dielectric such as SiO$_2$, Si$_3$N$_4$, etc. The base metal and the SiO$_2$ are patterned simultaneously by liftoff as the photoresist is dissolved away. This is a dual lift-off process because unwanted base metal and SiO$_2$ are both lifted off simultaneously. The resulting structure has base metal in the base contact areas overlaid with a dielectric which protects both the metal contact and the emitter sidewalls.

A second photoresist can then be used to form a mask to define the emitter metal. Alignment of this mask is not critical because the emitter metal can overlap the extrinsic base area or the base metal contact without concern for emitter-base shorting because of the previously deposited dielectric coverage.

These and other objects and features of the invention will be apparent from the following detailed description taken with reference to the accompanying drawings.

DESCRIPTION OF THE PREFERRED EMBODIMENT

Figure 1:
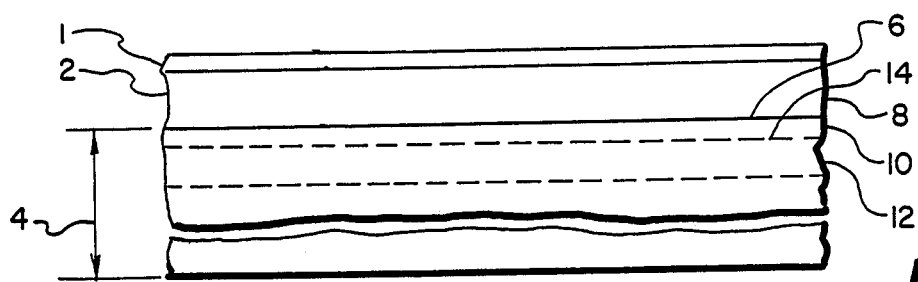
FIGS. 1-6 illustrate steps in the process of fabricating a heterojunction bipolar transistor (HBT) according to the invention.
Figure 2:
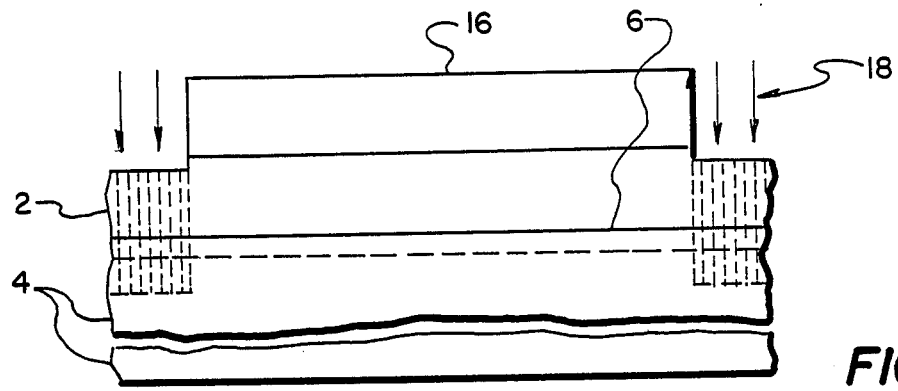

FIG. 1 shows a heterojunction bipolar semiconductor wafer suitable for forming a heterojunction bipolar transistor (HBT). Such a wafer can be formed using known growth technologies such as molecular beam epitaxy (MBE) or metal organic chemical vapor deposition (MOCVD). The wafer in FIG. 1 has a single heterojunction 6 formed between two different semiconductor compounds, AlGaAs 2 and GaAs 4. Because the AlGaAs semiconductor has n-type conductivity 8 and the adjacent GaAs has p-type conductivity 10, heterojunction 6 is also a p-n junction. A second p-n junction 14 is formed below heterojunction 6 by appropriate doping of GaAs semiconductor 4.

FIG. 1 also shows a cap layer 1 which is formed on top of the wafer to facilitate making ohmic contact to an emitter. Cap 1 is a thin layer of an n+-type conductivity material such as GaAs or InAs as is known in the prior art.

To define the location of a transistor on the wafer, a photoresist mask 16 is formed on cap layer 1 and an isolation implant 18 made around the transistor location. Additionally, cap layer 1 is etched to provide a mesa in the transistor location.

Figure 3:
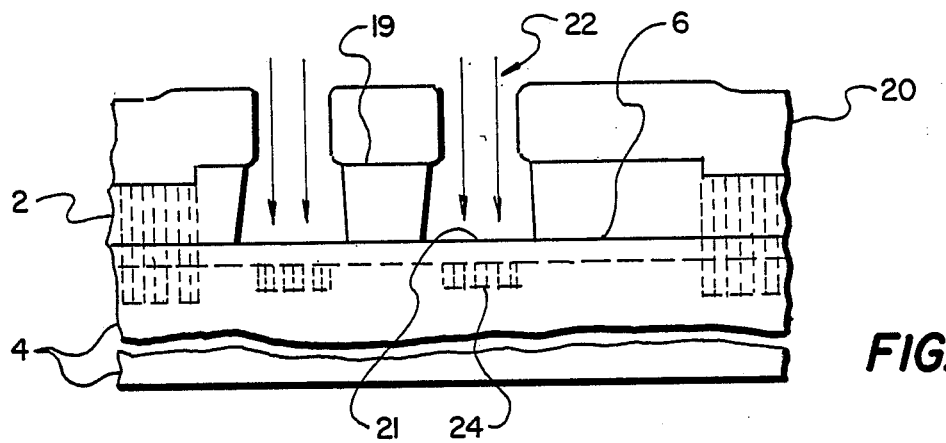

As shown in FIG. 3, photoresist 16 is removed and a second photoresist mask 20 is formed on the wafer. Openings in mask 20 define an emitter location 19, and semiconductor 2 is etched through these openings down to heterojunction 6 to define base location 21.

Protons 22 can be implanted through the openings into semiconductor 4 below the base location. This implanted area 24 reduces the HBT's extrinsic base-collector capacitance. Its location and depth is determined by the energy used to implant the protons. The term protons is used to include sources such as He, B, and $O_2$. The proton implantation is a self-aligned step because photoresist mask 20 is used rather than requiring an additional, separately aligned mask.

Figure 4:
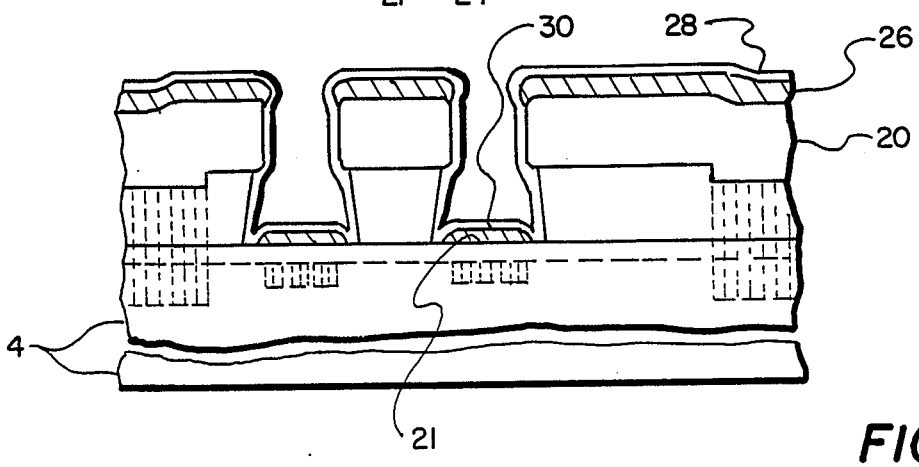

As shown in FIG. 4, base contact metal 26 is then deposited on photoresist mask 20 and on exposed base location 21 to form base contact 30. Base contact metal 26 is then covered with a dielectric 28 such as photoenhanced chemically vapor deposited $SiO_2$. Before depositing dielectric 28, the photoresist can be etched back somewhat using an $O_2$ plasma. Formation of base contact 30 and covering it with dielectric 26 are also self-aligned steps because an additional mask and alignment are not required.

Figure 5:
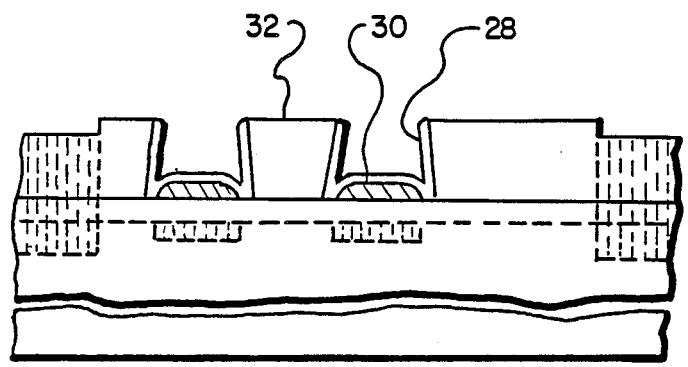

Photoresist mask 20 with its overlying deposits of contact metal 26 and dielectric 28 are lifted off the wafer. This dual lift-off step leaves dielectric 28 covering base contact 30 and the adjacent sidewalls. It also leaves an exposed emitter contact location 32 as shown in FIG. 5.

Figure 6:
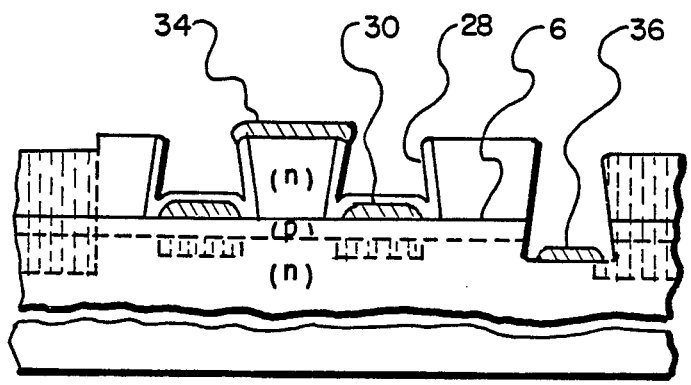

The emitter contact metal is defined by another photoresist mask, and emitter contact metal 34 is deposited. Although this step requires alignment of a new mask, the alignment is not as critical as required in prior art processes. Greater alignment tolerance is acceptable because contact 30 is covered with dielectric 26. As shown in FIG. 6, emitter contact metal 34 can overlap the extrinsic base location or base contact 30 without concern for emitter-base shorting because of the dielectric coverage. Such overlap, if it occurs, would produce only a slight increase in fringing capacitance.

The above steps complete the dual lift-off, self aligning feature of the invention, and fabrication of the collector contact can be completed using prior art techniques.

For the example shown in FIG. 6, a mask is provided to define a collector contact location, and the wafer is etched down to the n-type conductivity region 12 of the GaAs semiconductor compound 4. Collector contact metal 36 is then deposited through the opening and onto the collector contact location. The alignment required to define the contact location and deposit the contact metal is not critical (at least when compared to the emitter and base alignment), and consequently collector contact 36 can be provided without degrading the HBT's performance.

Interconnections of the three transistor contacts with other devices on the wafer can be accomplished using conventional masking, etching and metal deposition techniques.

Figure 7:
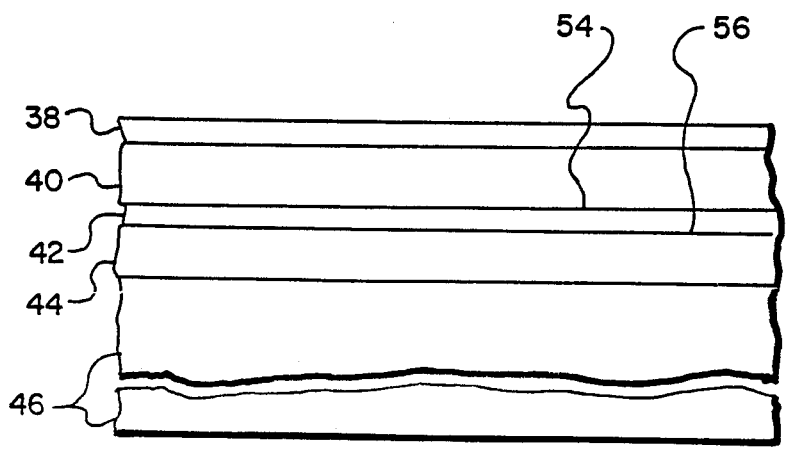
FIG. 7 illustrates a double heterojunction bipolar semiconductor wafer suitable for fabricating a HBT according to the invention.

In a second embodiment of the invention, a double heterojunction bipolar transistor is fabricated using the method of the invention. The starting wafer is a double heterojunction structure such as shown in FIG. 7 rather than the single heterostructure wafer shown in FIG. 6. A layer 44 of n-type conductivity AlGaAs is formed on a suitable GaAs substrate 46 using known growth techniques such as MBE or MOCVD. A layer 42 of p-type conductivity GaAs is grown on the AlGaAs layer 44, thus creating hetero-p-n junction 56. Another layer 40 of n-type conductivity AlGaAs, is grown on GaAs layer 42 to create the second hetero-p-n junction 54. Finally, cap layer 38 is formed on top of the wafer to facilitate making ohmic contact. The emitter base and collector contacts are then formed on appropriate p and n-type material as previously described for the single HBT.

Numerous other variations can be made without departing from the invention. For example, the composition of the semiconductors can be graded to provide improved lattice match and conductivity. Other Group III-V semiconductor compounds such as InP can be used. Also, p-n-p bipolar transistors in addition to the exemplary n-p-n bipolar transistors can be fabricated using appropriate dopants. The method can be applied using dual or multiple layer photoresist processes to facilitate liftoff. Accordingly, it should be understood that the form of the invention described above is illustrative and is not intended to limit the scope of the invention.

What is claimed is:

1. A method of fabricating a heterojunction bipolar transistor (HBT), comprising:
providing a heterojunction bipolar semiconductor wafer having a first layer of a semiconductor of one conductivity type, a second layer of a semiconductor of an opposite conductivity type on the first layer forming a first p-n junction, and a third layer of a semiconductor of the one conductivity type on the second layer forming a second p-n junction, at least one of the p-n junctions being a heterojunction;
forming a photoresist pattern on the wafer with an opening which defines a base location of the HBT;
etching the third layer through the opening to the second layer;
depositing base contact metal on the second layer through the opening;
depositing dielectric on the base contact metal and on the sidewalls of the opening;
lifting off the photoresist with its overlying dielectric and metal while maintaining dielectric on the sidewalls;
defining a location for emitter contact metal of the HBT on the third layer;
depositing emitter contact metal on the emitter contact location;
providing an opening to the first layer, and;
depositing collector contact metal on the first layer through the opening.

2. The method as claimed in claim 1 wherein the heterojunction bipolar semiconductor is a single heterojunction bipolar semiconductor and the heterojunction is the first p-n junction.

3. The method as claimed in claim 1, wherein the heterojunction bipolar semiconductor is a single heterojunction bipolar semiconductor and the heterojunction is the second p-n junction.

4. The method as claimed in claim 1 wherein the heterojunction bipolar semiconductor is a double heterojunction bipolar semiconductor and the heterojunction is the first and the second p-n junctions.

5. The method as claimed in claim 1 wherein the wafer includes a cap layer on the third layer.

6. The method as claimed in claim 5 including the step of etching the cap layer to provide a mesa cap for the HBT.

7. The method as claimed in claim 1 including the step of isolating an area on the wafer for the HBT by an isolation implant.

8. The method as claimed in claim 1 including the step of implanting protons into the first layer under the base location prior to depositing the base contact metal.

9. The method as claimed in claim 1 wherein the semiconductor is a III-V compound semiconductor.

10. The method as claimed in claim 1 including the step of etching back some of the photoresist prior to depositing the dielectric.

11. A self-aligned process for making a single heterojunction bipolar transistor (HBT) comprising:
providing a heterojunction bipolar semiconductor wafer having a negative conductivity type layer of GaAs, a positive conductivity type layer of GaAs on the negative conductivity type layer of GaAs, and a negative conductivity type layer of AlGaAs on the positive conductivity type layer of GaAs;
forming a photoresist pattern on the wafer with an opening which defines a base location of the HBT;
etching the negative conductivity type layer of AlGaAs through the opening down to the positive conductivity type layer of GaAs;
implanting protons through the opening into the negative conductivity type layer of GaAs;
depositing base contact metal on the GaAs through the opening;
depositing dielectric on the base contact metal and on the sidewalls of the opening;
lifting off the photoresist with its overlying dielectric and metal while maintaining dielectric on the sidewalls;
masking the remaining dielectric and the negative conductivity type layer of AlGaAs except for an emitter location;
depositing emitter contact metal on the AlGaAs at the emitter location;
providing an opening to the negative conductivity type layer of gaAs; and
depositing collector contact metal on the negative conductivity type layer of GaAs.

12. The method as claimed in claim 11 wherein the wafer includes a positive conductivity type cap layer on the negative conductivity type layer of AlGaAs, and including the step of etching the cap layer to provide a mesa cap for the HBT.

13. The method as claimed in claim 11 including the step of implanting protons into the wafer to reduce base-collector capacitance for the HBT.

14. A self-aligned process for making a double heterojunction bipolar transistor (HBT) comprising;
providing a double heterojunction bipolar semiconductor wafer having a top negative conductivity type layer of AlGaAs, an intermediate positive conductivity type layer of GaAs on the negative conductivity type layer of AlGaAs, and a bottom negative conductivity type layer of AlGaAs on the intermediate positive conductivity type layer of GaAs;
forming a photoresist pattern on the wafer with an opening which defines a base location of the HBT;
etching the top negative conductivity type layer of AlGaAs through the opening down to the intermediate positive conductivity type layer of GaAs;
implanting protons through the opening into the bottom negative conductivity type layer of AlGaAs;
depositing base contact metal on the intermediate positive conductivity type layer of GaAs through the opening;
depositing dielectric on the base contact metal and on the sidewalls of the opening;
lifting off the photoresist with its overlying dielectric and metal while maintaining dielectric on the sidewalls;
masking the remaining dielectric and the top negative conductivity type layer of AlGaAs except for an emitter location;
depositing emitter contact metal on the AlGaAs at the emitter location;
providing an opening to the bottom negative conductivity type layer of AlGaAs and;
depositing collector contact metal on the negative conductivity type layer of GaAs.

15. The method as claimed in claim 14 wherein the wafer includes a positive conductivity type cap layer on the top negative conductivity type layer of AlGaAs.

16. The method as claimed in claim 15 including the step of etching the cap layer to provide a mesa cap for the HBT.

17. The method as claimed in claim 15 including the step of implanting protons into the wafer to reduce base-collector capacitance.

18. A method of fabricating a heterojunction bipolar transistor (HBT), comprising:
providing a heterojunction bipolar semiconductor wafer having a first layer of a semiconductor of one conductivity type, a second layer of a semiconductor of an opposite conductivity type on the first layer forming a first p-n junction, and a third layer of a semiconductor of the one conductivity type on the second layer forming a second p-n junction, at least one of the p-n junctions being a heterojunction;
forming a photoresist pattern on the wafer with an opening which defines a base location of the HBT;
etching the third layer through the opening to the second layer;
depositing base contact metal on the second layer through the opening;
etching back some of the photoresist;
depositing dielectric on the base contact metal;
lifting off the photoresist with its overlying dielectric and metal;
defining a location for emitter contact metal of the HBT on the third layer;
depositing emitter contact metal on the emitter contact location;
providing an opening to the first layer, and;
depositing collector contact metal on the first layer through the opening.

* * * * *